(12) United States Patent
Howard et al.

(10) Patent No.: US 7,135,397 B2
(45) Date of Patent: Nov. 14, 2006

(54) METHOD AND SYSTEM FOR PACKAGING BALL GRID ARRAYS

(75) Inventors: Greg E. Howard, Dallas, TX (US); Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 10/659,181

(22) Filed: Sep. 10, 2003

(65) Prior Publication Data

US 2005/0064694 A1 Mar. 24, 2005

(51) Int. Cl.
*H01L 21/4763* (2006.01)
(52) U.S. Cl. ..................... 438/613; 438/614
(58) Field of Classification Search ........... 228/180.22; 438/613, 614; 257/80, 81, 783, 782
See application file for complete search history.

(56) References Cited

U.S. PATENT DOCUMENTS 4,573,105 A * 2/1986 Beldavs ................ 361/768
5,164,336 A * 11/1992 Ohno et al. ............ 228/180.22
6,180,504 B1 * 1/2001 Farnworth et al. .......... 438/612
6,531,022 B1 * 3/2003 Tsukahara .................... 156/256
6,595,404 B1 * 7/2003 Suzuki et al. ................ 228/175
6,613,662 B1 * 9/2003 Wark et al. ................. 438/613
6,614,003 B1 * 9/2003 Hembree et al. ........... 219/209

OTHER PUBLICATIONS

ASAT Glossary, Page 1 taken from www.ASAT.com website.*
"Challenges in High Yield, Fine Pitch Solder Ball Attachment", by Ivy Qin, et al., SEMI—Semicon Singapore—Semiconductor Packaging Conference, pp. 1-10.

* cited by examiner

*Primary Examiner*—S. V. Clark
(74) *Attorney, Agent, or Firm*—Yingsheng Tung; Wade James Brady, III; Frederick J. Telecky, Jr.

(57) ABSTRACT

According to one embodiment of the invention, a method of packaging ball grid arrays includes providing a substrate having a plurality of holes formed therein. Each hole is associated with a respective one of a plurality of contact pads formed on a first surface of the substrate. The method further includes disposing a plurality of balls within respective ones of the plurality of holes such that at least a portion of each ball projects outwardly from the first surface, and applying a force to each of the balls from above the first surface to couple the balls to the substrate.

10 Claims, 2 Drawing Sheets

METHOD AND SYSTEM FOR PACKAGING BALL GRID ARRAYS

TECHNICAL FIELD OF THE INVENTION

This invention relates generally to the field of integrated circuit packaging and, more specifically, to a method and system for packaging ball grid arrays.

BACKGROUND OF THE INVENTION

There are many different types of integrated circuit packages and many different techniques for manufacturing integrated circuit packages. For example, one type of integrated circuit package is a ball grid array package. Ball grid array packages are desirable because, among other attributes, they save valuable printed circuit board space. Because of the desirable attributes of BGAs, integrated circuit package manufacturers desire to find reliable and cost-effective ways to manufacture BGAs.

Many factors determine whether or not ball grid array ("BGA") packages are fabricated in a cost effective manner. One such factor is the quality of the bond between the balls and the substrate. If quality is substandard, then the BGA package will not pass the testing phase. For example, drop test and board level reliability ("BLR") requirements for integrated circuit packages, especially BGA packages, can be difficult to meet given the stringent ball attach requirements of the packages.

SUMMARY OF THE INVENTION

According to one embodiment of the invention, a method of packaging ball grid arrays includes providing a substrate having a plurality of holes formed therein. Each hole is associated with a respective one of a plurality of contact pads formed on a first surface of the substrate. The method further includes disposing a plurality of balls within respective ones of the plurality of holes such that at least a portion of each ball projects outwardly from the first surface, and applying a force to each of the balls from above the first surface to couple the balls to the substrate.

Some embodiments of the invention provide numerous technical advantages. Other embodiments may realize some, none, or all of these advantages. For example, by utilizing a ball grid array packaging method as described herein, delamination of balls from the substrate is substantially reduced or eliminated. This leads to better board level reliability and drop test capabilities for BGA packages. In addition, the ball attachment and reflow process may be accomplished in the same step.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Figure 1:
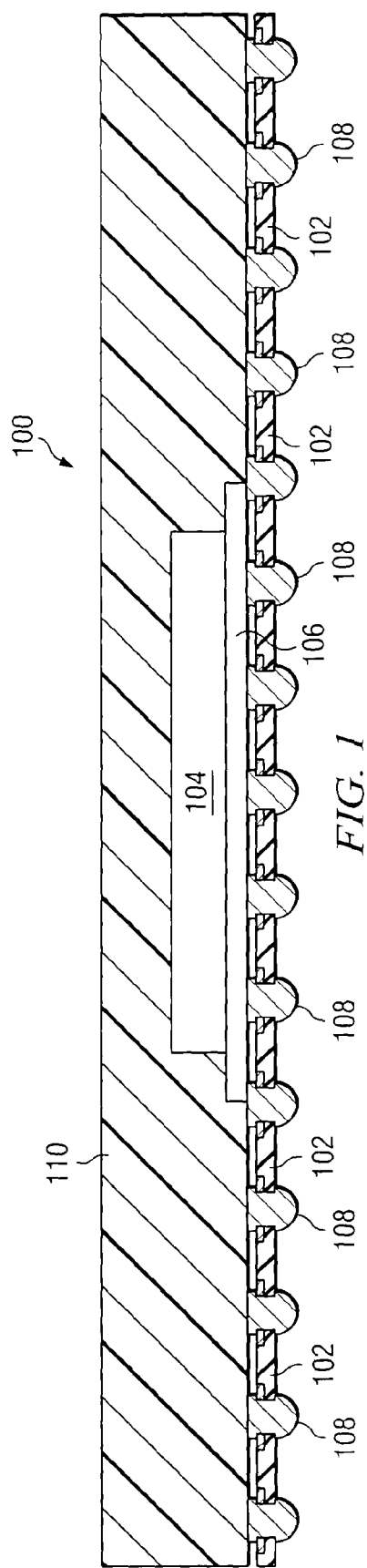
FIG. 1 is a cross-sectional elevation view of a ball grid array packaged according to one embodiment of the present invention.
Figure 2A:
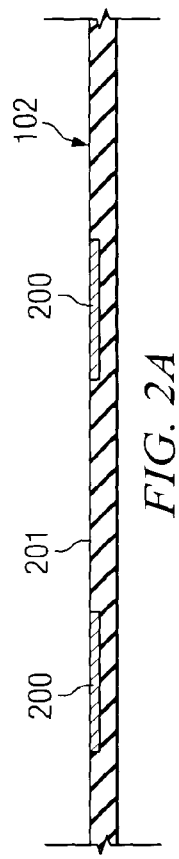
FIGS. 2A through 2E are a series of cross-sectional elevation views illustrating an example method of packaging a ball grid array in accordance with an embodiment of the invention.
Figure 2B:
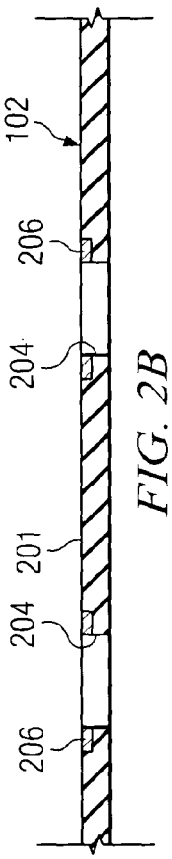
Figure 2C:
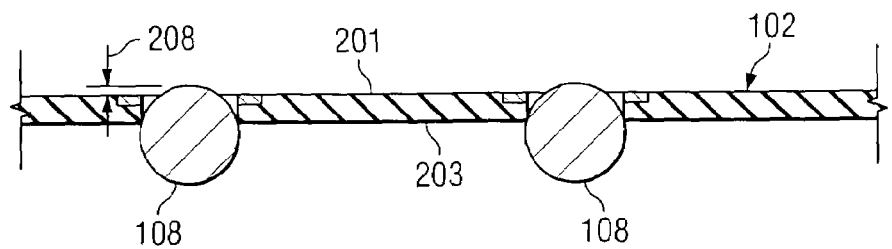
Figure 2D:
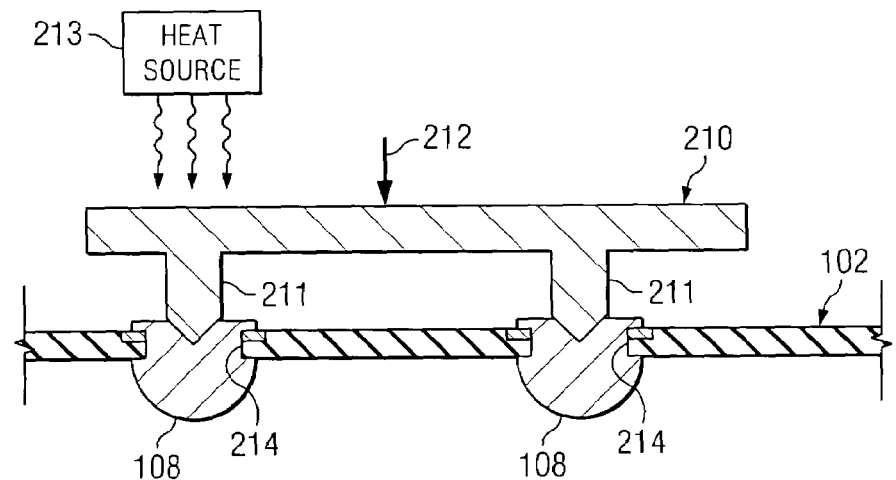
Figure 2E:
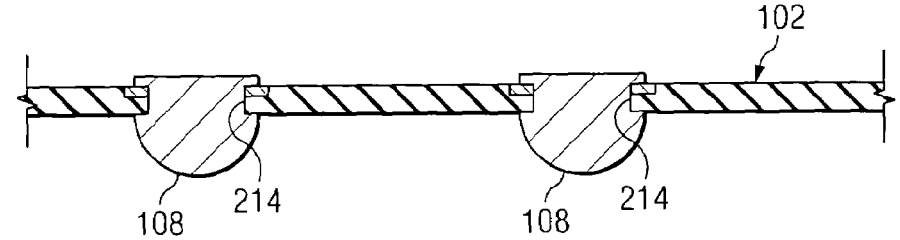

Example embodiments of the present invention and their advantages are best understood by referring now to FIGS. 1 through 2E of the drawings, in which like numerals refer to like parts.

FIG. 1 is a cross-sectional elevation view of a ball grid array ("BGA") package 100 manufactured according to the teachings of one embodiment of the present invention. BGA package 100 resembles a typical BGA package and, as such, includes a substrate 102 having a die 104 attached to a first side of substrate 102 with a die attach 106 and a plurality of solder balls 108 disposed through holes in substrate 102 and attached to a suitable copper pattern formed on the first side of substrate 102. A molding 110 encapsulates die 104 to complete BGA package 100. Although not illustrated in FIG. 1, a solder mask may also be disposed between die attach 106 and the copper pattern formed on the first side of substrate 102. One difference between BGA package 100 and standard BGA packages is the way the balls 108 are attached to substrate 102.

Because of strict testing requirements for BGA packages, such as a drop test and board level reliability tests, BGA packages need to be manufactured with high quality and reliability. One important mode of failure of BGA packages during testing is the mechanical attachment of the balls to the substrate. Poor and/or weak mechanical bonds between the balls and the substrate as well as delamination of the balls may result in poor yield as well as poor quality and reliability. Therefore, according to the teachings of one embodiment of the invention, solder balls 108 as illustrated in FIG. 1 are coupled to substrate 102 utilizing a "pop rivet" method as outlined below in conjunction with FIGS. 2A through 2E.

FIGS. 2A through 2E are a series of cross-sectional elevation views illustrating an example method of solder balls 108 to substrate 102 in accordance with an embodiment of the invention. Referring to FIG. 2A, only a portion of substrate 102 is illustrated (for clarity purposes) with two bond pads 200 that are formed on a first side 201 of substrate 102. Substrate 102 may be any suitable substrate, such as a tape substrate or a laminate substrate, and may have any suitable thickness. In the illustrated embodiment, substrate 102 is a tape substrate having a thickness of approximately fifty microns. Substrate 102 includes a suitable copper (or other suitable conductive material) pattern formed therein that includes any number of bond pads 200 interconnected with any suitable number and arrangement of traces. Bond pads 200 may be any suitable size and shape. In the illustrated embodiment, bond pads 200 are generally circularly shaped and couple to respective solder balls 108, as described in more detail below.

In order to couple solder balls 108 to bond pads 200, a plurality of holes 204 need to be formed in substrate 102. This is illustrated in FIG. 2B. Although holes 204 may be any suitable size and shape, holes 204 are generally circular in shape and may be formed in substrate 102 utilizing any suitable method, such as punching or drilling. The size of holes 204 may depend on the size of balls 108 and/or the spacing of bond pads 200. Also illustrated in FIG. 2B is an annulus 206 of bond pads 200. This represents that holes 204 are formed within the perimeter of bond pads 200 so that when balls 108 are eventually coupled to substrate 102 good contact exists between annulus 206 and balls 108, as described in greater detail below.

Referring to FIG. 2C, balls 108 are disposed within respective holes 204. Solder balls 108 may have any suitable diameter and may be formed from any suitable material. The diameter of balls 108 may depend on any number of factors, such as spacing of bond pads 200 and the type of BGA package 100 being fabricated. For example, in an embodiment for a bond pad pitch of 0.5 mm, the original diameter of balls 108 is approximately 280 µm. The material of balls 108 may be eutectic solder, lead-free solder, gold, or other suitable material. Balls 108 may be disposed within holes 204 using any suitable method and, in one embodiment, are disposed within holes 204 from below a second surface 203 of substrate 108. In one embodiment, at least a portion of each ball 108 projects outwardly from first surface 201 of substrate 102. A distance 208 that each ball 108 projects outwardly from surface 201 may be any suitable distance; however, in a particular embodiment, distance 208 is approximately twenty-five to fifty microns.

Referring now to FIG. 2D, a punch tool 210 having a plurality of punches 211 is utilized to apply a force (as denoted by arrow 212) to each ball 108 in order to couple balls 108 to substrate 102. Any suitable punch tool 210 having any suitable punches 211 may be utilized. Although punches 211 may have any suitable profile, in a particular embodiment, punches 211 have generally pointed ends so that when the force is applied to balls 108 the ends of punches 211 spread out the material near the top portion of balls 108 and cause the top portion to "grab on" to edges 214 of holes 204, as illustrated in FIG. 2D. The result is that a strong mechanical bond exists between balls 108 and substrate 102, which facilitates BGA package 100 meeting stringent testing requirements, such as drop test and board level reliability tests, as well as combining the solder ball attachment and solder reflow process steps into one process step, which saves considerable time and money in packaging BGA package 100.

Also illustrated in FIG. 2D is a heat source 213. Heat source 213 may be used in some embodiments to heat punch tool 210 before the force is applied to the top portion of balls 108, which may help the reflow part of the process easier. Any suitable heat source 213 may be utilized. In addition, although FIG. 2D illustrates punch tool 210 simultaneously applying the force to the top portion of balls 108, the force may also be applied non-simultaneously, depending on the type of punch tool 210 utilized.

Thus, as referring to FIG. 2E, solder balls 108 are coupled to substrate 102 with a strong mechanical bond that facilitates BGA package 100 meeting stringent testing requirements, such as drop test and board level reliability tests, which increases the quality and reliability of BGA package 100. The attachment and reflow process is also combined into one process, which saves time. In addition, the ball attachment is accomplished at the beginning of the packaging process instead of last. After solder balls 108 are attached to substrate 102, the solder mask, die attach 106, die 104 may be coupled to substrate 102 before molding 110 encapsulates die 104, thereby completing BGA package 100.

Although embodiments of the invention and their advantages are described in detail, a person skilled in the art could make various alterations, additions, and omissions without departing from the spirit and scope of the present invention, as defined by the appended claims.

What is claimed is:

1. A method of packaging ball grid arrays, comprising:
   providing a substrate having a plurality of holes formed therein, each hole associated with a respective one of a plurality of contact pads formed on a first surface of the substrate;
   disposing a plurality of balls within respective ones of the plurality of holes such that at least a portion of each ball projects outwardly from the first surface; and
   applying a force to each of the balls outwardly with a heated punch tool from the first surface to deform the tops of each ball such that a portion of each ball overlaps the substrate to grab a proximate edge of its respective hole to couple the balls to the substrate.

2. The method of claim 1, wherein providing the substrate further comprises providing a tape substrate having a thickness of approximately 50 microns.

3. The method of claim 1, wherein providing the substrate further comprises providing a laminate substrate.

4. The method of claim 1, wherein the portion of each ball projects outwardly from the first surface by a distance of approximately 25 to 50 microns.

5. The method of claim 1, wherein applying the force to each of the balls comprises simultaneously applying the force to each of the balls.

6. A method of packaging ball grid arrays, comprising:
   providing a substrate having a plurality of holes formed therein, each hole formed within a respective one of a plurality of contact pads formed on a first surface of the substrate;
   disposing, from below a second surface of the substrate, a plurality of balls within respective ones of the plurality of holes;
   causing at least a portion of each ball to project outwardly from the first surface;
   disposing a punch tool adjacent the first surface of the substrate, the punch tool having a plurality of punches arranged in a pattern that substantially matches a pattern of the balls;
   heating the punch tool; and
   applying a force to each of the balls with respective punches to deform the tops of each ball such that a portion of each ball overlaps the substrate to grab a proximate edge of its respective hole to couple the balls to the substrate.

7. The method of claim 6, wherein providing the substrate further comprises providing a tape substrate having a thickness of approximately 50 microns.

8. The method of claim 6, wherein providing the substrate further comprises providing a laminate substrate.

9. The method of claim 6, wherein the portion of each ball projecting outwardly from the first surface by a distance of approximately 25 to 50 microns.

10. The method of claim 6, wherein applying the force to each of the balls comprises simultaneously applying the force to each of the balls.

* * * * *